(12) United States Patent
Ma et al.

(10) Patent No.: US 9,501,117 B2
(45) Date of Patent: Nov. 22, 2016

(54) IDENTIFICATION CIRCUIT FOR POWER SOURCING EQUIPMENT, AND POWERED DEVICE

(71) Applicant: Huawei Technologies Co., Ltd., Shenzhen (CN)

(72) Inventors: Zheng Ma, Shenzhen (CN); Zhiji Deng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 194 days.

(21) Appl. No.: 14/521,911

(22) Filed: Oct. 23, 2014

(65) Prior Publication Data

US 2015/0046728 A1  Feb. 12, 2015

Related U.S. Application Data

(63) Continuation of application No. PCT/CN2013/074284, filed on Apr. 17, 2013.

(51) Int. Cl.
| | |
|---|---|
| *G06F 1/26* | (2006.01) |
| *H04L 12/10* | (2006.01) |
| *G01R 31/40* | (2014.01) |
| *H04L 12/413* | (2006.01) |
| *H02J 7/00* | (2006.01) |

(52) U.S. Cl.
CPC ............... *G06F 1/26* (2013.01); *G01R 31/40* (2013.01); *H02J 7/0004* (2013.01); *H04L 12/10* (2013.01); *H04L 12/413* (2013.01)

(58) Field of Classification Search
CPC ........................................................ G06F 1/26
See application file for complete search history.

(56) References Cited

U.S. PATENT DOCUMENTS

| | | | | |
|---|---|---|---|---|
| 7,516,340 | B2* | 4/2009 | Landry | H04L 12/10 323/316 |
| 7,839,154 | B2* | 11/2010 | Hussain | H04L 12/10 324/713 |
| 7,979,168 | B2* | 7/2011 | Velez | H04L 12/10 323/267 |
| 9,141,500 | B2* | 9/2015 | Tu | G06F 11/24 |

(Continued)

FOREIGN PATENT DOCUMENTS

| | | |
|---|---|---|
| CN | 201323469 Y | 10/2009 |
| CN | 201708542 U | 1/2011 |

(Continued)

OTHER PUBLICATIONS

Foreign Communication From a Counterpart Application, International Application No. PCT/CN2013/074284, International Search Report dated Jan. 23, 2014, 8 pages.
Foreign Communication From a Counterpart Application, International Application No. PCT/CN2013/074284, Written Opinion dated Jan. 23, 2014, 4 pages.

(Continued)

*Primary Examiner* — Nitin Patel
(74) *Attorney, Agent, or Firm* — Conley Rose, P.C.

(57) ABSTRACT

An electronic detection circuit for detecting a power level provided by a power sourcing device to a powered device in a Power over Ethernet (POE) system, the electronic detection circuit comprising a power input end, a power output end, a charge retention module configured to generate a control voltage from the input voltage, a load module configured to draw power at a test power level from the power sourcing device, a connection switch, and an overload detection module connected to receive the input voltage to detect whether the input voltage has dropped to zero during the test period.

17 Claims, 2 Drawing Sheets

(56) References Cited

U.S. PATENT DOCUMENTS

| | | | |
|---|---|---|---|
| 2007/0103829 A1 | 5/2007 | Darshan et al. | |
| 2008/0062586 A1* | 3/2008 | Apfel | H04L 12/10 361/18 |
| 2011/0278949 A1 | 11/2011 | Tsai et al. | |
| 2012/0104853 A1 | 5/2012 | Yasuda | |
| 2013/0013949 A1 | 1/2013 | Mohammed | |
| 2013/0031383 A1* | 1/2013 | Tuen | H04L 12/10 713/300 |
| 2013/0162038 A1 | 6/2013 | Falk et al. | |
| 2014/0164795 A1 | 6/2014 | Wright et al. | |

FOREIGN PATENT DOCUMENTS

| | | |
|---|---|---|
| CN | 101969230 A | 2/2011 |
| CN | 102801208 A | 11/2012 |
| CN | 102844953 A | 12/2012 |
| EP | 2555378 A1 | 2/2013 |
| JP | 2001119861 A | 4/2001 |
| WO | 2010040015 A2 | 4/2010 |

OTHER PUBLICATIONS

Texas Instruments, Inc., "IEEE 802.3af Power Interface Switch for Power Over Ethernet (PoE) Powered Devices," TPS2370, Aug. 2002, Revised Mar. 2004, 18 pages.

Microsemi, "Understanding 802.3at; PoE Plus Standard Increases Available Power," Jun. 2011, 7 pages.

Foreign Communication From a Counterpart Application, Chinese Application No. 201380000490.9, Chinese Office Action dated Mar. 31, 2016, 3 pages.

Foreign Communication From a Counterpart Application, Chinese Application No. 201380000490.9, Chinese Search Report dated Mar. 22, 2016, 2 pages.

Robbins, S., "An Extended Classification Protocol for PoE Plus (Revised)," Xixia, Internet Citation, Retrieved from the Internet:URL:http://www.ieee802.org/3/poep_study/public/jul05/robbins_2_0705.pdf, [retrieved on Feb. 21, 2007], XP002421634, Jul. 2005, 23 pages.

Foreign Communication From a Counterpart Application, European Application No. 13882187.1 Extended European Search Report dated Sep. 14, 2015, 5 pages.

\* cited by examiner

IDENTIFICATION CIRCUIT FOR POWER SOURCING EQUIPMENT, AND POWERED DEVICE

CROSS-REFERENCE TO RELATED APPLICATIONS

This application is a continuation of International Application No. PCT/CN2013/074284, filed on Apr. 17, 2013, which is hereby incorporated by reference in its entirety.

TECHNICAL FIELD

This application relates to the field of circuits, and in particular, to an identification circuit for a power sourcing device, and a powered device.

BACKGROUND

In a networking environment of fiber to the distribution point (FTTdp), a network device is usually disposed far away from a power source, such as outdoors, in a passageway, or between floors, so it is difficult for the network device to be powered.

A power over Ethernet (POE) technology allows a power sourcing equipment (PSE) to transmit data and at the same time directly supply, through the same Ethernet cable, power to a network device which has a power interface and may be used as a powered device (PD), thereby enabling the network device to take power through a lower-level device (which is usually disposed inside a room of a user, can easily connect to a power source, and is connected to the network device through an Ethernet cable) of the network device.

At present, there are two types of POE standards: 802.3af and 802.3at. A difference between the standard 802.3at and the standard 802.3af lies in that a highest grade of power in the standard 802.3at may reach 25.5 Watts (W), while a highest grade of power in the standard 802.3af only reaches 12.95 W.

Because the power sourcing equipment and the powered device are developed independently, using the research and development of the powered device as an example, the developer of the powered device cannot foresee the standard on which the power sourcing device used by a customer is based; and if the customer connects a powered device designed on the basis of the standard 802.3at to a power sourcing equipment designed on the basis of the standard 802.3af, it is possible that overload power-off is caused, because the powered device requests a power of 25.5 W, but the power sourcing equipment cannot provide a power exceeding 12.95 W.

SUMMARY

A main technical problem to be solved by this application is to provide an identification circuit for a power sourcing equipment, and a powered device, which can differentiate different types of power sourcing equipment, so that the powered device limits a grade which is beyond a power supply capability of the power sourcing equipment, thereby preventing overload power-off.

In order to solve the foregoing technical problem, a first aspect of this application provides an electronic detection circuit for detecting a power level provided by a power sourcing device to a powered device in a Power over Ethernet system, wherein the power sourcing device is capable of providing power at a supply voltage at either a high power level or a low power level and has an overload reaction time for the power sourcing device to shutdown in response to being overloaded, the electronic detection circuit comprising a power input end for connecting to the power sourcing device to receive an input voltage from the power sourcing device; a power output end for connecting to the powered device to provide power to the powered device; a charge retention module configured to generate a control voltage from the input voltage, wherein the control voltage is configured to ramp from zero to a threshold voltage value over a test period after the power input end is connected to the power sourcing device and if the input voltage is maintained at the supply voltage over the test period, wherein the test period is selected to be longer than the overload reaction time of the power sourcing device; a load module configured to draw power at a test power level from the power sourcing device, wherein the test power level is between the high power level and the low power level, and wherein the load module is controlled by the control voltage to stop drawing power when the control voltage reaches the threshold voltage value; a connection switch controlled by the control voltage and disposed to connect power from the power input end to the power output end when the control voltage reaches the threshold voltage value; an overload detection module connected to receive the input voltage to detect whether the input voltage has dropped to zero during the test period and to generate a power level indicating signal, the power level indicating signal having a first value indicating that the power sourcing device is of the high power level when the input voltage has not dropped to zero during the test period, and a second value indicating that the power sourcing device is of the lower power level when the input voltage has dropped to zero during the test period.

In order to solve the foregoing problem, this application also provides a powered device, and a method for detecting a power level provided by a power sourcing device to a powered device in a POE system.

In the foregoing solution, in power sourcing equipment type test mode, the power sourcing equipment is forbidden to supply power to the powered device, and the load module, of which a rated power is between maximum powers provided by two types of power sourcing equipment, is used for testing whether the power sourcing equipment is overloaded and powered off, and two different types of identification signals are generated using characteristics of the power sourcing equipment when overloaded, so that the powered device limits a grade which is beyond a power supply capability of the power sourcing equipment, thereby preventing overload power-off. After the power sourcing equipment type test is complete (at this time, the grade of the powered device is already limited), the controlled switch is turned on, so that the power sourcing equipment can normally supply power to the powered device.

DESCRIPTION OF EMBODIMENTS

In the following description, for description rather than limitation, specific details of a particular system structure, an interface, a technology, and the like are put forward, so as to thoroughly understand this application. However, a person skilled in the art should understand that this application may also be implemented in another implementation manner without these specific details. In another situation, detailed description of a well-known apparatus, circuit, and method is omitted, so as to prevent unnecessary details from interfering with the description of this application.

Figure 1:
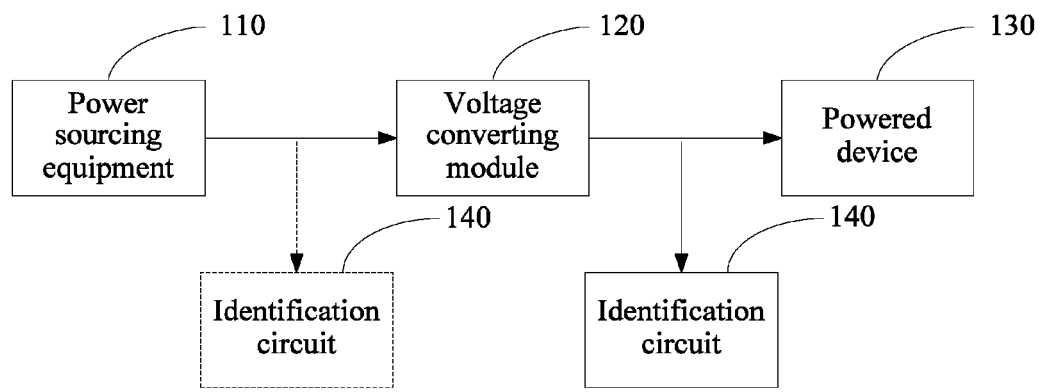
FIG. 1 is a schematic diagram of a connection between an identification circuit for a power sourcing equipment and another circuit according to this application.

FIG. 1 is a schematic diagram of a connection between an identification circuit for a power sourcing equipment and another circuit according to this application. As shown in FIG. 1, the power sourcing equipment 110 is coupled to a voltage converting module 120, and the voltage converting module 120 is coupled to a powered device 130. An identification circuit 140 of the power sourcing equipment 110 according to this application may be coupled between the power sourcing equipment 110 and the voltage converting module 120, or coupled between the voltage converting module 120 and the powered device 130.

Before power supply, the identification circuit 140 of the power sourcing equipment 110 identifies whether the power sourcing equipment 110 is a first power sourcing equipment or a second power sourcing equipment. The first power sourcing equipment and the second power sourcing equipment have different supply powers, the first power sourcing equipment can provide a greater supply power than the second power sourcing equipment, and the first power sourcing equipment and the second power sourcing equipment generate overload protection when a load power exceeds the supply powers of the first power sourcing equipment and the second power sourcing equipment. For example, the first power sourcing equipment is a power sourcing equipment adopting a standard 802.3at, and the second power sourcing equipment is a power sourcing equipment adopting a standard 802.3af. If the identification circuit 140 of the power sourcing equipment 110 is coupled between the power sourcing equipment 110 and the voltage converting module 120, the identification circuit 140 of the power sourcing equipment 110 directly performs identification through a voltage which is output by the power sourcing equipment 110; and if the identification circuit 140 of the power sourcing equipment 110 is coupled between the voltage converting module 120 and the powered device 130, the identification circuit 140 of the power sourcing equipment 110 performs identification through a voltage obtained after the voltage converting module 120 performs conversion. After the identification is complete, the power sourcing equipment 110 supplies power to the powered device 130. While supplying power, the power sourcing equipment 110 outputs a voltage to the voltage converting module 120, and the voltage converting module 120 converts the voltage which is output by the power sourcing equipment 110 into a voltage required by the powered device 130. The voltage converting module 120 outputs the voltage obtained through conversion to the powered device 130, so as to provide the powered device 130 with the voltage for use.

Figure 2:
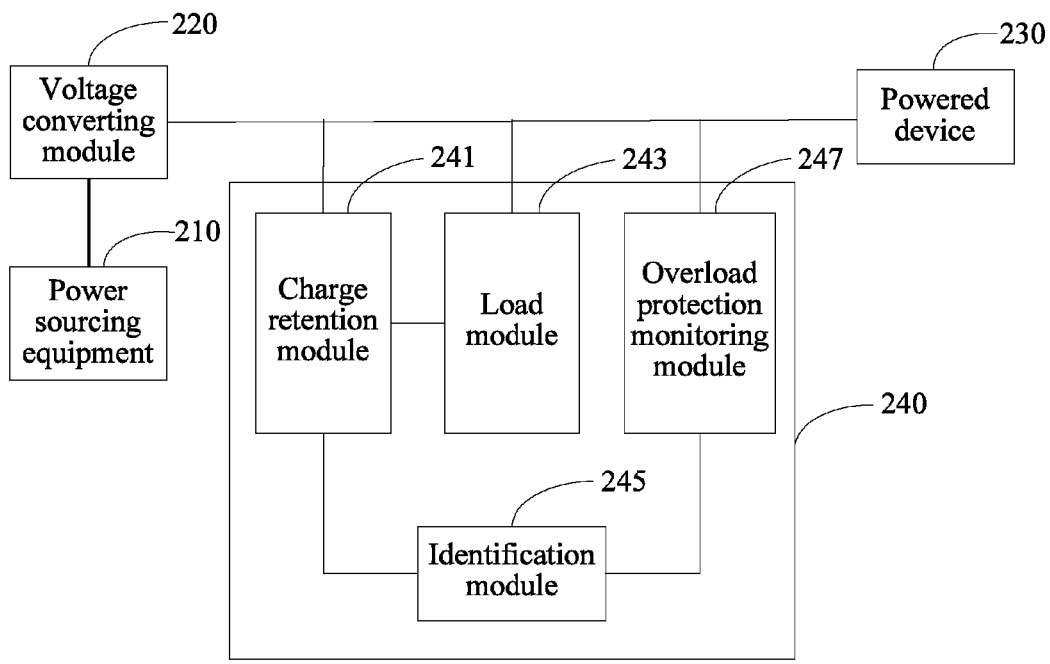
FIG. 2 is a schematic structural diagram of an implementation manner of an identification circuit for a power sourcing equipment according to this application.

FIG. 2 is a schematic structural diagram of an implementation manner of an identification circuit for a power sourcing equipment according to this application. An identification circuit 240 of a power sourcing equipment in this implementation manner includes a charge retention module 241, a load module 243, an identification module 245, and an overload protection monitoring module 247.

The charge retention module 241 is connected to a voltage converting module 220, and outputs, after being charged by an input voltage of the voltage converting module 220, a first charging voltage to the load module 243. When a difference between the input voltage of the voltage converting module 220 and the first charging voltage is greater than a threshold, the load module 243 is connected to the voltage converting module 220. A load power of the load module 243 is set as that when the power sourcing equipment 210 is a first power sourcing equipment, the power sourcing equipment 210 does not generate overload protection, but when the power sourcing equipment 210 is a second power sourcing equipment, the power sourcing equipment 210 generates overload protection. The overload protection monitoring module 247 detects whether the power sourcing equipment 210 generates overload protection. When the power sourcing equipment 210 generates overload protection, the identification module 245 is charged by the first charging voltage and outputs a second charging voltage as an identification signal.

Figure 3:
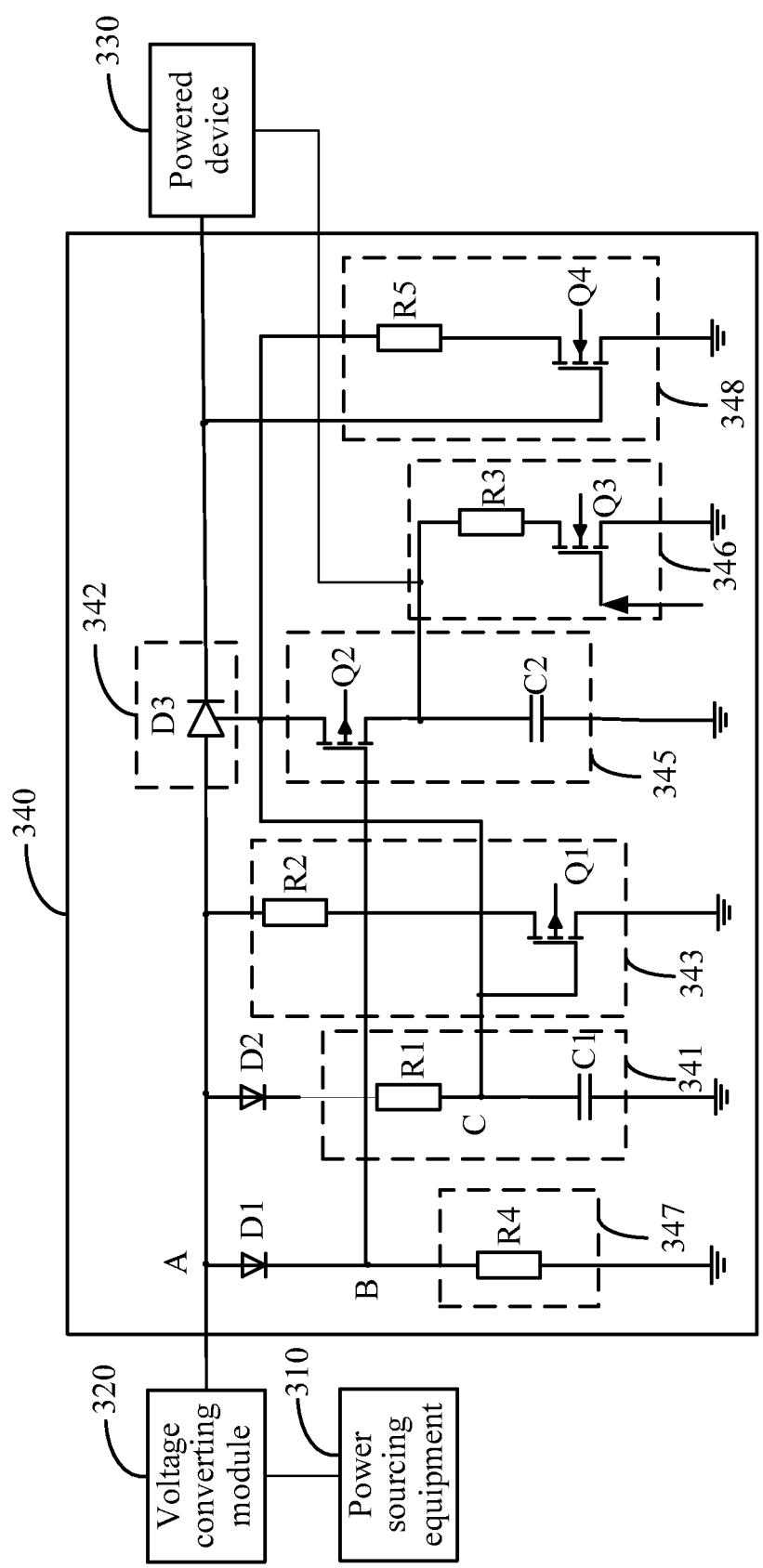
FIG. 3 is a circuit diagram of an implementation manner of the identification circuit for a power sourcing equipment shown in FIG. 2.

FIG. 3 is a circuit diagram of a specific implementation manner of the identification circuit for a power sourcing equipment shown in FIG. 2. The following gives a description using that, as an example, a first power sourcing equipment is a power sourcing equipment adopting a standard 802.3at, a second power sourcing equipment is a power sourcing equipment adopting a standard 802.3af, and after a voltage that is output by a power sourcing equipment 310 undergoes voltage conversion of a voltage converting module 320, the voltage converting module 320 outputs a conversed voltage obtained through conversion to an identification circuit 340, so as to identify whether the power sourcing equipment 310 is the first power sourcing equipment or the second power sourcing equipment.

The identification circuit 340 of the power sourcing equipment in this implementation manner includes a charge retention module 341, a controlled switching module 342, a load module 343, an identification module 345, a first discharging module 346, and an overload protection monitoring module 347.

The charge retention module 341 includes a first resistor R1 and a first capacitor C1, where a first pin of the first resistor R1 is configured to be coupled to the power sourcing equipment 310 or the voltage converting module 320, a second pin of the first resistor R1 is coupled to a first pin of the first capacitor C1, and a second pin of the first capacitor C1 is grounded.

The controlled switching module 342 is a silicon controlled rectifier.

The load module 343 includes a second resistor R2 and a first switching tube Q1, where a first pin of the second resistor R2 is configured to be coupled to the power sourcing equipment 310 or the voltage converting module 320, a second pin of the second resistor R2 is coupled to a first pin of the first switching tube Q1, a control pin of the first switching tube Q1 is coupled to a common pin of the first resistor R1 and the first capacitor C1, and a second pin of the first switching tube Q1 is grounded.

The identification module 345 includes a second switching tube Q2 and a second capacitor C2, where a first pin of the second switching tube Q2 is separately coupled to the control pin of the controlled switching module D3 and the common pin of the first resistor R1 and the first capacitor C1, a control pin of the second switching tube Q2 is coupled to the overload protection monitoring module 347, a second pin of the second switching tube Q2 is coupled to a first pin of the second capacitor C2, a second pin of the second capacitor C2 is grounded, and a common pin of the second switching tube Q2 and the second capacitor C2 is used as an output pin of the identification module 345.

The first discharging module 346 includes a third resistor R3 and a third switching tube Q3, where a first pin of the third resistor R3 is coupled to the output pin of the identification module 345, a second pin of the third resistor R3 is coupled to a first pin of the third switching tube Q3, a control pin of the third switching tube Q3 is configured to input a discharging signal output by a powered device 330, and a second pin of the third switching tube Q3 is grounded.

The overload protection monitoring module 347 is a fourth resistor R4. In another implementation manner, the overload protection monitoring module 347 may also be a plurality of resistors in a series-parallel connection, or a resistor and a capacitor in a series connection.

The second discharging module 348 includes a fifth resistor R5 and a fourth switching tube Q4, where a first pin of the fifth resistor R5 is coupled to the common pin of the first resistor R1 and the first capacitor C1, a second pin of the fifth resistor R5 is coupled to a first pin of the fourth switching tube Q4, a control pin of the fourth switching tube Q4 is coupled to an output pin of the controlled switching module 342, and a second pin of the fourth switching tube Q4 is grounded.

The following gives an analysis according to whether the power sourcing equipment 310 is the first power sourcing equipment or the second power sourcing equipment.

(1) If the power sourcing equipment 310 is the first power sourcing equipment, a working process of the identification circuit 340 is as follows:

Before the power sourcing equipment 310 supplies power, the voltage output by the power sourcing equipment 310 undergoes voltage conversion of the voltage converting module 320. The voltage converting module 320 converts the voltage provided by the power sourcing equipment 310 into a voltage which is suitable for the powered device 330. The voltage converting module 320 outputs a voltage of 12 volts (V), and only a small amount of distributed capacitance exists in a branch where a first diode D1 and the fourth resistor R4 are located, so a current quickly passes through the first diode D1 and the fourth resistor R4, so that a voltage at a node B quickly increases to a voltage (that is, the voltage of 12 V) at a node A. However, in a branch where a second diode D2, the first resistor R1, and the first capacitor C1 are located, due to the existence of the first capacitor C1, the current passes through the second diode D2 and the first resistor R1 to charge the first capacitor C1, so that a voltage at a node C slowly increases to the voltage of 12 V at the node A, so as to form the first charging voltage. In an ideal state, resistance values of the fourth resistor R4 and the first resistor R1 and a capacitance value of the first capacitor C1 are set, so that the voltage at the node B instantly increases to the voltage of 12 V at the node A, while the node C increases to a voltage of 9.5 V after 80 milliseconds, and increases to the voltage of 12 V at the node A after 200 milliseconds.

During 0 millisecond to 80 milliseconds after the power sourcing equipment 310 outputs the voltage, the voltage at the node C is less than or equal to 9.5 V. The silicon controlled rectifier D3 is set, so that when a voltage that is input to the control pin of the silicon controlled rectifier D3 is less than 9.5 V, the silicon controlled rectifier D3 is in a turned-off state. Therefore, during 0 millisecond to 80 milliseconds after the power sourcing equipment 310 outputs the voltage, the silicon controlled rectifier D3 is always in the turned-off state, and the voltage of 12 V that is output by the voltage converting module 320 cannot be output to the powered device 330, so as to prevent the powered device 330 as a load from establishing a connection with the voltage converting module 320, which thereby affects a test result.

At the same time, because the voltage at the node C is less than or equal to 9.5 V, the first charging voltage which is input to the control pin of the first switching tube Q1 is also less than or equal to 9.5 V, while the voltage which is input through the second resistor R2 to the first pin of the first switching tube Q1 by the voltage converting module 320 is 12 V, a difference between the voltage at the first pin of the first switching tube Q1 and the voltage at the control pin of the first switching tube Q1 is greater than a threshold which enables the first switching tube Q1 to be turned on, the first switching tube Q1 is turned on, the current passes through the second resistor R2 and the first switching tube Q1, establishment of a connection between the load module 343 and the voltage converting module 320 is implemented, and a detection state is entered. A rated power of the second resistor R2 is between 13 W and 25 W, so when the power sourcing equipment 310 is the first power sourcing equipment, the power sourcing equipment 310 can provide a supply power of 25.5 W, which is greater than the rated power of the second resistor R2, and the power sourcing equipment 310 is not overloaded. The power sourcing equipment 310 is always supplying power normally, a voltage at the first pin of the second switching tube Q2 is always less than or equal to a voltage at the control pin of the second switching tube Q2, so the second switching tube Q2 is always being turned off, the second capacitor C2 is not charged, and the common pin (that is, the output pin of the identification module 345) of the second switching tube Q2 and the second capacitor C2 outputs a low level.

80 milliseconds later after the power sourcing equipment 310 outputs the voltage, the voltage at the node C increases to a voltage greater than 9.5 V, while the voltage that is input through the second resistor R2 to the first pin of the first switching tube Q1 by the voltage converting module 320 is 12 V, the difference between the voltage at the first pin of the first switching tube Q1 and the voltage at the control pin of the first switching tube Q1 is less than the threshold which enables the first switching tube Q1 to be turned on, and the first switching tube Q1 is turned off, so the current cannot pass through the second resistor R2 and the first switching tube Q1, the load module 343 does not consume the supply power any longer, and the detection state is exited. At the same time, the voltage that is output by the node C to the control pin of the silicon controlled rectifier D3 is greater than 9.5 V, the silicon controlled rectifier D3 is turned on, all the power that is output by the voltage converting module 320 is transmitted to the powered device 330, and the powered device 330 works normally. After the silicon controlled rectifier D3 is turned on, the voltage output by the voltage converting module 320 is input through the silicon controlled rectifier D3 to the control pin of the fourth switching tube Q4, so that the fourth switching tube Q4 is turned on, thereby discharging, through the fifth resistor R5 and the fourth switching tube Q4, charges stored in the first capacitor C1, so as to prevent the charges from existing in the first capacitor C1 and affect the effect of a next test. After the powered device 330 works normally, the powered device 330 detects that the output pin of the identification module 345 outputs a low level, thereby learning that the power sourcing equipment 310 is the first power sourcing equipment, which can provide the powered device 330 with a sufficient supply power, and no alteration needs to be made on the powered device 330. The powered device 330 outputs the discharging signal to the control pin of the third switching tube Q3, so that the third switching tube Q3 is turned on. If charges exist in the second capacitor C2, the charges in the second capacitor C2 flow back into the "ground" through the third resistor R3 and the third switching tube Q3, and the second capacitor C2 is compulsively reset to a zero level, so as to prevent the charges from existing in the second capacitor C2 and affect the effect of a next test.

(2) If the power sourcing equipment 310 is the second power sourcing equipment, a working process of the identification circuit 340 is as follows:

Before the power sourcing equipment 310 supplies power, the voltage output by the power sourcing equipment 310 undergoes voltage conversion of the voltage converting module 320. The voltage converting module 320 converts the voltage provided by the power sourcing equipment 310 into a voltage which is suitable for the powered device 330. The voltage converting module 320 outputs a voltage of 12 V, and only a small amount of distributed capacitance exists in a branch where a first diode D1 and the fourth resistor R4 are located, so a current quickly passes through the first diode D1 and the fourth resistor R4, so that a voltage at a node B quickly increases to a voltage (that is, the voltage of 12 V) at a node A. However, in a branch where a second diode D2, the first resistor R1, and the first capacitor C1 are located, due to the existence of the first capacitor C1, the current passes through the second diode D2 and the first resistor R1 to charge the first capacitor C1, so that a voltage at a node C slowly increases to the voltage of 12 V at the node A, so as to form the first charging voltage. In an ideal state, resistance values of the fourth resistor R4 and the first resistor R1 and a capacitance value of the first capacitor C1 are set, so that the voltage at the node B instantly increases to the voltage of 12 V at the node A, while the node C increases to a voltage of 9.5 V after 80 milliseconds, and increases to the voltage of 12 V at the node A after 200 milliseconds.

During 0 millisecond to 80 milliseconds after the power sourcing equipment 310 outputs the voltage, the voltage at the node C is less than or equal to 9.5 V. The silicon controlled rectifier D3 is set, so that when a voltage that is input to the control pin of the silicon controlled rectifier D3 is less than 9.5 V, the silicon controlled rectifier D3 is in a turned-off state. Therefore, during 0 millisecond to 80 milliseconds after the power sourcing equipment 310 outputs the voltage, the silicon controlled rectifier D3 is always in the turned-off state, and the voltage of 12 V that is output by the voltage converting module 320 cannot be output to the powered device 330, so as to prevent the powered device 330 as a load from establishing a connection with the voltage converting module 320, which thereby affects a test result.

At the same time, because the voltage at the node C is less than or equal to 9.5 V, the first charging voltage which is input to the control pin of the first switching tube Q1 is also less than or equal to 9.5 V, while the voltage which is input through the second resistor R2 to the first pin of the first switching tube Q1 by the voltage converting module 320 is 12 V, a difference between the voltage at the first pin of the first switching tube Q1 and the voltage at the control pin of the first switching tube Q1 is greater than a threshold which enables the first switching tube Q1 to be turned on, the first switching tube Q1 is turned on, the current passes through the second resistor R2 and the first switching tube Q1, and establishment of a connection between the load module 343 and the voltage converting module 320 is implemented. A rated power of the second resistor R2 is between 13 W and 25 W, so when the power sourcing equipment 310 is the second power sourcing equipment, the power sourcing equipment 310 can only provide a maximum supply power of 12.95 W, which is less than the rated power of the second resistor R2, and the power sourcing equipment 310 is overloaded. According to agreement in a protocol, during 50 milliseconds to 75 milliseconds after the power sourcing equipment 310 is overloaded, overload power-off protection occurs in the power sourcing equipment 310, the power sourcing equipment 310 suspends power supply for 2 seconds, and after 2 seconds, the power sourcing equipment 310 restores power supply to the powered device 330. Therefore, 50 milliseconds later after the second resistor R2 establishes a connection with the voltage converting module 320, the power sourcing equipment 310 suspends power supply. At this time, the first charging voltage output by the node C is about 7.2 V. Due to the existence of the first capacitor C1, the voltage at the node C does not quickly decrease as the power sourcing equipment 310 suspends power supply, but only a small amount of distributed capacitance exists in the branch where the node B is located, so the voltage at the node B quickly decreases as the power sourcing equipment 310 suspends power supply. A voltage at the first pin of the second switching tube Q2 is always greater than a voltage at the control pin of the second switching tube Q2, so the second switching tube Q2 is turned on, and the first capacitor C1 charges the second capacitor C2 through the second switching tube Q2, so that the output pin of the identification module 345 outputs a high level. After 2 seconds, the power sourcing equipment 310 restores power supply, and continues to charge, according to the foregoing process, the second capacitor C2 on a basis of 7.2 V. When the voltage at the node C increases to a voltage greater than 9.5 V, while the voltage input through the second resistor R2 to the first pin of the first switching tube Q1 by the voltage converting module 320 is 12 V, the difference between the voltage at the first pin of the first switching tube Q1 and the voltage at the control pin of the first switching tube Q1 is less than the threshold which enables the first switching tube Q1 to be turned on, the first switching tube Q1 is turned off, the current cannot pass through the second resistor R2 and the first switching tube Q1, the load module 343 does not consume the supply power any longer, and the detection state is exited. At the same time, the voltage that is output by the node C to the control pin of the silicon controlled rectifier D3 is greater than 9.5 V, the silicon controlled rectifier D3 is turned on, all the power that is output by the voltage converting module 320 is transmitted to the powered device 330, and the powered device 330 works normally. After the silicon controlled rectifier D3 is turned on, the voltage output by the voltage converting module 320 is input through the silicon controlled rectifier D3 to the control pin of the fourth switching tube Q4, so that the fourth switching tube Q4 is turned on, thereby discharging, through the fifth resistor R5 and the fourth switching tube Q4, charges stored in the first capacitor C1, so as to prevent the charges from existing in the first capacitor C1 and affect the effect of a next test. After the powered device 330 works normally, the powered device 330 detects that the output pin of the identification module 345 outputs a high level, thereby learning that the power sourcing equipment 310 is the second power sourcing equipment, which cannot provide the powered device 330 with a sufficient supply power exceeding 12.95 W, and the powered device 330 limits a grade setting of the powered device 330, so that the powered device 330 cannot request a power exceeding 12.95. The powered device 330 outputs the discharging signal to the control pin of the third switching tube Q3, so that the third switching tube Q3 is turned on. The charges in the second capacitor C2 flow back into the "ground" through the third resistor R3 and the third switching tube Q3, and the second capacitor C2 is compulsively reset to a zero level, so as to prevent the charges from existing in the second capacitor C2 and affect the effect of a next test.

It may be understood that this embodiment is a specific circuit implementation manner, and replacement and extension made on some simple components shall be construed as falling within the scope of the present invention. For example, the overload protection monitoring module 347 may be a resistor, or may be a plurality of resistors in a series-parallel connection. Alternatively, the fourth resistor R4 is in a series connection with a capacitor, as long as it is ensured that a product of multiplying a resistance value of the fourth resistor R4 by a capacitance value of the capacitor is less than that of multiplying a resistance value of the first resistor R1 by a capacitance value of the first capacitor C1, so that an increase speed of the voltage at the node B is greater than that of the voltage at the node C.

When the identification circuit 340 is disposed between the power sourcing equipment 310 and the voltage converting module 320 to perform identification, a specific process thereof is similar to the foregoing process, as long as parameters of some components are changed accordingly, and details are not repeatedly described herein.

This application further provides a powered device, where the identification circuit for a power sourcing equipment descried in any one of the foregoing implementation manners is adopted, and details are not repeatedly described herein.

In several implementation manners provided in this application, it should be understood that the disclosed system, apparatus, and method may be implemented in other ways. The described apparatus embodiments are merely exemplary. For example, dividing of the modules or units is merely a type of logical function dividing, and there may be other dividing manners during actual implementation. For example, a plurality of units or components may be combined or integrated into another system, or some features may be ignored or not performed. In addition, the shown or discussed mutual coupling or direct couplings or communication connections may be implemented through some interfaces. The indirect couplings or communication connections between the apparatuses or units may be in electrical, mechanical, or other forms.

The units described as separate components may be or may not be physically separated, and parts displayed as units may be or may not be physical units, may be located in one position, or may be distributed on a plurality of network units. A part or all of the units may be selected according to actual demands to achieve the objective of the solutions of the embodiments.

In addition, functional units in the embodiments of this application may be integrated in one processing unit, each of the units may exist alone physically, and two or more units may also be integrated in one unit. The integrated unit may be implemented in a form of hardware, and may also be implemented in a form of a software functional unit.

What is claimed is:

1. An electronic detection circuit for detecting a power level provided by a power sourcing device to a powered device in a Power over Ethernet (POE) system, wherein the power sourcing device is capable of providing power at a supply voltage at either a high power level or a low power level and has an overload reaction time for the power sourcing device to shutdown in response to being overloaded, the electronic detection circuit comprising:

a power input end for connecting to the power sourcing device to receive an input voltage from the power sourcing device;

a power output end for connecting to the powered device to provide power to the powered device;

a charge retention module configured to generate a control voltage from the input voltage, wherein the control voltage is configured to ramp from zero to a threshold voltage value over a test period after the power input end is connected to the power sourcing device, and wherein, when the input voltage is maintained at the supply voltage over the test period, the test period is selected to be longer than the overload reaction time of the power sourcing device;

a load module configured to draw power at a test power level from the power sourcing device, wherein the test power level is between the high power level and the low power level, and wherein the load module is controlled by the control voltage to stop drawing power when the control voltage reaches the threshold voltage value;

a connection switch controlled by the control voltage and disposed to connect power from the power input end to the power output end when the control voltage reaches the threshold voltage value; and an overload detection module connected to receive the input voltage to detect whether the input voltage has dropped to zero during the test period and to generate a power level indicating signal, the power level indicating signal having a first value indicating that the power sourcing device is of the high power level when the input voltage has not dropped to zero during the test period, and a second value indicating that the power sourcing device is of the lower power level when the input voltage has dropped to zero during the test period.

2. The electronic detection circuit according to claim 1, wherein the charge retention module comprises a first resistor and a first capacitor, wherein a first pin of the first resistor is coupled to the power input end, wherein a second pin of the first resistor is coupled to a first pin of the first capacitor, wherein a second pin of the first capacitor is grounded, and wherein the first pin of the first capacitor provides the control voltage.

3. The electronic detection circuit according to claim 2, wherein the load module comprises a load resistor and a first switching device, wherein a first pin of the load resistor is coupled to the power input end, wherein a second pin of the load resistor is coupled to a first pin of the first switching device, wherein a control pin of the first switching device is coupled to the first pin of the first capacitor to receive the control voltage, wherein a second pin of the first switching device is grounded, and wherein, when the input voltage is at the supply voltage, the first switching device is turned on when the control voltage is lower than the threshold voltage value and is turned off when the control voltage reaches or exceeds the threshold voltage value.

4. The electronic detection circuit according to claim 3 further comprising a first discharging module, wherein the first discharging module comprises a third resistor and a third switching device, wherein a first pin of the third resistor is coupled to an output pin of the overload detection module, wherein a second pin of the third resistor is coupled to a first pin of the third switching device, wherein a control pin of the third switch device is configured to receive a discharging signal generated by the powered device, and wherein a second pin of the third switching device is grounded.

5. The electronic detection circuit according to claim 4 further comprising a second discharging module, wherein the second discharging module comprises a fifth resistor and a fourth switching device, wherein a first pin of the fifth resistor is coupled to the first pin of the first capacitor, wherein a second pin of the fifth resistor is coupled to a first pin of the fourth switch, wherein a control pin of the fourth switch is coupled to an output pin of the connection switch, and a wherein second pin of the fourth switch is grounded.

6. The electronic detection circuit according to claim 1, wherein the test power level of the load module is between approximately 13 Watts (W) and approximately 25 W, wherein the overload reaction time of the power sourcing device is from approximately 50 milliseconds to approximately 75 milliseconds after the power sourcing device is overloaded, and wherein the test period is approximately 80 milliseconds.

7. A powered device having an electronic detection circuit for detecting a power level provided by a power sourcing device, wherein the electronic detection circuit comprises:
- a power input end for connecting to the power sourcing device to receive an input voltage from the power sourcing device;
- a power output end for connecting to the powered device to provide power to the powered device;
- a charge retention module configured to generate a control voltage from the input voltage, wherein the control voltage is configured to ramp from zero to a threshold voltage value over a test period after the power input end is connected to the power sourcing device, and wherein, when the input voltage is maintained at the supply voltage over the test period, the test period is selected to be longer than the overload reaction time of the power sourcing device;
- a load module configured to draw power at a test power level from the power sourcing device, wherein the test power level is between the high power level and the low power level, and wherein the load module is controlled by the control voltage to stop drawing power when the control voltage reaches the threshold voltage value;
- a connection switch controlled by the control voltage and disposed to connect power from the power input end to the power output end when the control voltage reaches the threshold voltage value; and
- an overload detection module connected to receive the input voltage to detect whether the input voltage has dropped to zero during the test period and to generate a power level indicating signal, the power level indicating signal having a first value indicating that the power sourcing device is of the high power level when the input voltage has not dropped to zero during the test period, and a second value indicating that the power sourcing device is of the lower power level when the input voltage has dropped to zero during the test period.

8. The powered device according to claim 7, wherein, when the electronic detection circuit generates the power level indicating signal indicating that the power sourcing device is of the lower power level, the powered device limits a grade setting of the powered device.

9. The powered device according to claim 7, wherein the charge retention module comprises a first resistor and a first capacitor, wherein a first pin of the first resistor is coupled to the power input end, wherein a second pin of the first resistor is coupled to a first pin of the first capacitor, wherein a second pin of the first capacitor is grounded, and wherein the first pin of the first capacitor provides the control voltage.

10. The electronic detection circuit according to claim 9, wherein the load module comprises a load resistor and a first switching device, wherein a first pin of the load resistor is coupled to the power input end, wherein a second pin of the load resistor is coupled to a first pin of the first switching device, wherein a control pin of the first switching device is coupled to the first pin of the first capacitor to receive the control voltage, wherein a second pin of the first switching device is grounded, and wherein, when the input voltage is at the supply voltage, the first switching device is turned on when the control voltage is lower than the threshold voltage value and is turned off when the control voltage reaches or exceeds the threshold voltage value.

11. The electronic detection circuit according to claim 10 further comprising a first discharging module, wherein the first discharging module comprises a third resistor and a third switching device, wherein a first pin of the third resistor is coupled to an output pin of the overload detection module, wherein a second pin of the third resistor is coupled to a first pin of the third switching device, wherein a control pin of the third switch device is configured to receive a discharging signal generated by the powered device, and wherein a second pin of the third switching device is grounded.

12. The electronic detection circuit according to claim 11 further comprising a second discharging module, wherein the second discharging module comprises a fifth resistor and a fourth switching device, wherein a first pin of the fifth resistor is coupled to the first pin of the first capacitor, wherein a second pin of the fifth resistor is coupled to a first pin of the fourth switch, wherein a control pin of the fourth switch is coupled to an output pin of the connection switch, and wherein a second pin of the fourth switch is grounded.

13. The electronic detection circuit according to claim 7, wherein the test power level of the load module is between approximately 13 Watts (W) and approximately 25 W, the overload reaction time of the power sourcing device is from approximately 50 milliseconds to approximately 75 milliseconds after the power sourcing device is overloaded, and the test period is approximately 80 milliseconds.

14. A method for detecting a power level provided by a power sourcing device to a powered device in a Power over Ethernet (POE) system, the method comprising:
- generating, by a charge retention module, a control voltage from the input voltage, wherein the control voltage is configured to ramp from zero to a threshold voltage value over a test period after the power input end is connected to the power sourcing device, and wherein, when the input voltage is maintained at the supply voltage over the test period, the test period is selected to be longer than the overload reaction time of the power sourcing device;
- loading, by a load module, through drawing power at a test power level from the power sourcing device, wherein the test power level is between the high power level and the low power level, and wherein the load module is controlled by the control voltage to stop drawing power when the control voltage reaches the threshold voltage value;
- generating, by an overload detection module, a power level indicating signal, wherein the power level indicating signal having a first value indicating that the power sourcing device is of the high power level when the input voltage has not dropped to zero during the test period, and a second value indicating that the power sourcing device is of the lower power level when the input voltage has dropped to zero during the test period; and limiting a grade setting of the powered device when the power level indicating signal indicates that the power sourcing device is of the lower power level.

15. The method according to claim 14, wherein the control voltage ramps from zero to a threshold voltage value of approximately 9.5 volts (V) over a test period of approximately 80 milliseconds after the power input end is connected to the power sourcing device.

16. The method according to claim 14, wherein the test power level of the load module is between approximately 13 W and approximately 25 W, the overload reaction time of the power sourcing device is from approximately 50 milliseconds to approximately 75 milliseconds after the power sourcing device is overloaded.

17. The method according to claim 14 further comprising discharging, by a discharging module, charges in a capacitor of the electronic detection circuit.

\* \* \* \* \*